United States Patent [19]

Alpaugh et al.

[11] 4,155,775
[45] May 22, 1979

[54] CLEANING OF HIGH ASPECT RATIO THROUGH HOLES IN MULTILAYER PRINTED CIRCUIT BOARDS

[75] Inventors: Warren A. Alpaugh, Chenango Forks; Michael J. Canestaro, Endicott; Theron L. Ellis, Vestal, all of N.Y.

[73] Assignee: International Business Machines Corporation, Armonk, N.Y.

[21] Appl. No.: 860,033

[22] Filed: Dec. 12, 1977

[51] Int. Cl.² .................................................. B08B 3/08
[52] U.S. Cl. .................................... 134/3; 134/22 R; 134/22 C; 134/26; 134/28; 134/37; 156/644
[58] Field of Search .................. 134/3, 22 R, 22 C, 28, 134/37, 26; 156/644, 645, 656; 427/307, 309

[56] References Cited

U.S. PATENT DOCUMENTS

| 3,462,832 | 8/1969 | Kubik | 156/645 X |
| 3,653,997 | 4/1972 | Rothschild et al. | 156/644 |
| 4,012,307 | 3/1977 | Phillips | 156/644 X |

FOREIGN PATENT DOCUMENTS 2309196  9/1974  Fed. Rep. of Germany ........... 156/644

*Primary Examiner*—Marc L. Caroff
*Attorney, Agent, or Firm*—Cyril A. Krenzer

[57] ABSTRACT

A cleaning process for high aspect ratio through holes of multilayer printed circuit boards assures the removal of any loosened fiberous material or epoxy smears in the through holes and also provides an inverted "T" structure at the innerplanes of the internal conductive circuits within the printed circuit board sandwich. The inverted "T" structure helps to move the contact point between the plating of the through hole and the internal circuit lines further into the circuit board, thereby eliminating the "Z" stress at the edge of the innerplane. This process is accomplished by first vapor blasting the through holes, soaking the board in a suitable solvent to loosen any fibers or smears on the circuit innerplanes of the board, removing the excess solvent from the through holes and then feeding a unilateral stream of a cleaning solution through the holes, the cleaning solution operating to remove excess fibers and smears in the through holes and to produce a slight, uniform etchback of the metal innerplanes of the printed circuit boards. Thereafter, the solution may be reduced and any excess cleaning solution is removed.

8 Claims, 3 Drawing Figures

CLEANING OF HIGH ASPECT RATIO THROUGH HOLES IN MULTILAYER PRINTED CIRCUIT BOARDS

BACKGROUND OF THE INVENTION

1. Field of the Invention

The present invention relates to the cleaning of through holes in multilayer printed circuit boards, and more particularly relates to the cleaning of high aspect ratio through holes in multilayer printed circuit boards.

2. Description of the Prior Art

In the development of printed circuit boards, the circuit line densities on the board surfaces and innerplanes have increased and in addition the number of layers in a multilayer board has also increased to provide the necessary circuit capability. Accompanying these two phenomena have been the requirement that the size of the through holes in multilayer printed circuit boards be smaller to use up less of the board and innerplane surfaces. This has resulted in relatively high aspect ratio through holes in the multilayer printed circuit board to provide the necessary interconnections between the external planes of the printed circuit board and the internal planes of the printed circuit boards. The aspect ratio is defined as the length of the through hole (thickness of the multilayer printed circuit board) compared to the diameter of the through hole.

As the aspect ratio of the multilayer printed circuit boards has increased, it has become more difficult to effectively plate in a reliable fashion the necessary conductive metal in the through holes. Much of this has been due to the difficulty of removing internal smears, burrs, etc. from the through holes which are formed as a result of drilling or forming the through holes in the multilayer board. Conventional prior art techniques, such as vapor spraying and air blasting, do not provide the necessary cleanliness of the through holes prior to plating since with the high aspect ratio, the force of the vapor spray or air blast is diminished long before it proceeds through the hole.

With the difficulties in cleaning, have come the problems of failing to provide adequate contact to the innerplanes when the through hole is plated and a failure to provide a strong enough bond between the plated through hole and the innerplanes. The bond reliability may be viewed as being partially due to the increased "Z" stress placed on the through hole when interconnecting pins are passed therethrough.

In a paper entitled "Copper Plating Advanced Multilayer Boards — A Capability Study" by W. A. Alpaugh and J. M. McCreary presented at the Institute of Printed Circuit Meeting of Sept. 20, 1976, it was noted that many of these problems can be eliminated in high aspect ratio through holes, if a slightly recessed "T" connection can be provided at the intersection between the plated through holes and the innerplane. However, to accomplish such a reliable "T" connection, it is necessary that there be a uniform etchback of the innerplanes and a very thorough, uniform cleaning of the materials in the high aspect ratio through holes.

OBJECTS AND SUMMARY OF THE INVENTION

Accordingly, it is a principal object of the present invention to provide an improved cleaning process for high aspect ratio through holes in multilayer printed circuit boards which overcome the foregoing difficulties of the prior art.

Another object of the present invention is to provide an improved process for cleaning high aspect ratio through holes in multilayer printed circuit boards which provides a uniform "T" connection capability at the boundary between the through hole and the innerplanes of the multilayer printed circuit boards.

Yet another object of the invention is to provide an improved process for cleaning high aspect ratio through holes in multilayer printed circuit boards which is both economical and reliable.

The foregoing and other objects and advantages of the invention are accomplished according to one embodiment whereby the through holes in a multilayer printed circuit board are first subjected to a vapor blasting at approximately right angles to the printed circuit board surface, following which the board is soaked in a suitable solvent to loosen any fibers or smears on the circuit innerplanes of the through holes in the board. Next, the excess solvent is removed from the through holes and a unilateral stream of a cleaning solution is passed through the through holes, the cleaning solution operating to remove excess fibers and smears in the through holes and further to produce a uniform etchback of the metal innerplanes of the printed circuit board. Thereafter, the cleaning solution may be reduced and any excess cleaning solution is removed from the through holes.

DESCRIPTION OF THE PREFERRED EMBODIMENT

Figure 1:
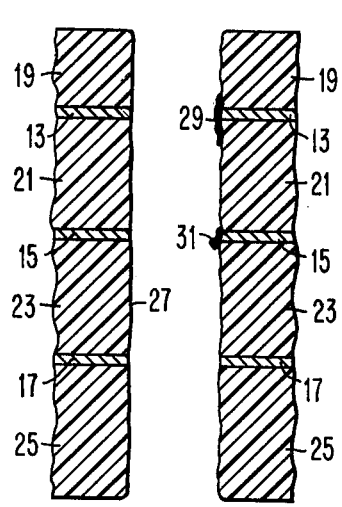
FIG. 1 is a partial cross-sectional view of a high aspect ratio through hole in a multilayer printed circuit board after the holes has been drilled in the board, but prior to cleaning and plating.

For a better understanding of the present invention together with other further objects and advantages thereof, reference is had to the following detailed description taken in conjunction with the above-described drawings. Referring first to FIG. 1, there is shown in partial sectional view a drilled through hole 11 in a printed circuit board having three innerplanes, primarily of copper or other similar conductive metals, 13, 15 and 17. The innerplanes are separated by insulating layers 19, 21, 23 and 25. Following the drilling operation, the internal edge 27 of the through hole 11 is relatively rough and may have smears 29 or jagged particles 31 extending therefrom which must be removed prior to a plating operation.

Figure 2:
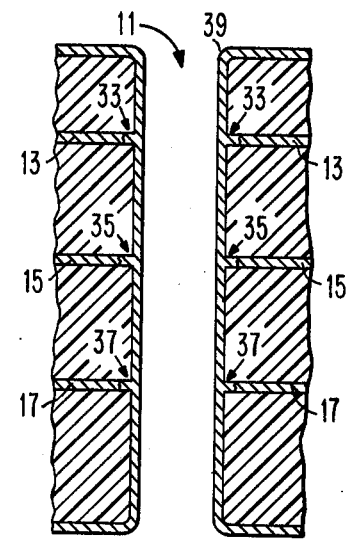
FIG. 2 is a partial cross-sectional view of a high aspect ratio through hole in a multilayer printed circuit board after the drilled hole has been cleaned and plated.

Further, as illustrated in FIG. 2., it is desired that the innerplanes 13, 15 and 17 be etched back slightly from the surface edge of the inner hole to provide "T" connections 33, 35 and 37 between the innerplanes and the plated conductor 39. With the resultant configuration as shown in FIG. 2, the "Z" stresses exerted on the interplated surface 39 due to pin insertion, thermal stress or other stresses applied thereto, are minimized since there is no sheer edge at which point the stresses and subsequent failures can occur.

In order to clean the through holes and remove the debris 29 and 31 therefrom, the panel is treated in the following manner. First, a vapor blast is directed at substantially right angles to the surface of the board and directed downward through the hole. After the vapor blast, the board is placed in a soak solution of N-methyl-2-pyrrolidone of 100% concentration for a period of approximately 5 minutes. Thereafter, it is removed from the N-methyl-2-pyrrolidone and placed in a soak solution of 100% methyl chloroform for about 4 minutes. The board is then removed from the soak bath and dried with an air blow-off of any remaining liquid for approximately 1½ minutes.

Once the board is dried, it is placed on a support and a solution of chrome/sulfuric acid comprising about 40–50% sulfuric acid with 50–80 grams per liter of $CrO_3$ are gravity fed through the holes for approximately 1¼ minutes. Next, a drag out with deionized water is unilaterally fed through the board for about ½ minute, followed by a reducing solution comprising about 21 grams per liter of sodium bisulfite in solution being gravity fed through the holes of the board for about 1 minute. This is followed by a second reducing solution again for about 1 minute.

After the solutions in the board and through holes have been removed, a running rinse using deionized water is gravity fed through the holes for approximately 3 minutes following which the board is placed in a stagnant rinse soak bath using deionized water for between 10 and 20 minutes. Thereafter, the board is dried with an air blow-off, followed again by a vapor blast directed at approximately right angles to the board surface so that the vapor passes through the through holes in the board.

Figure 3:
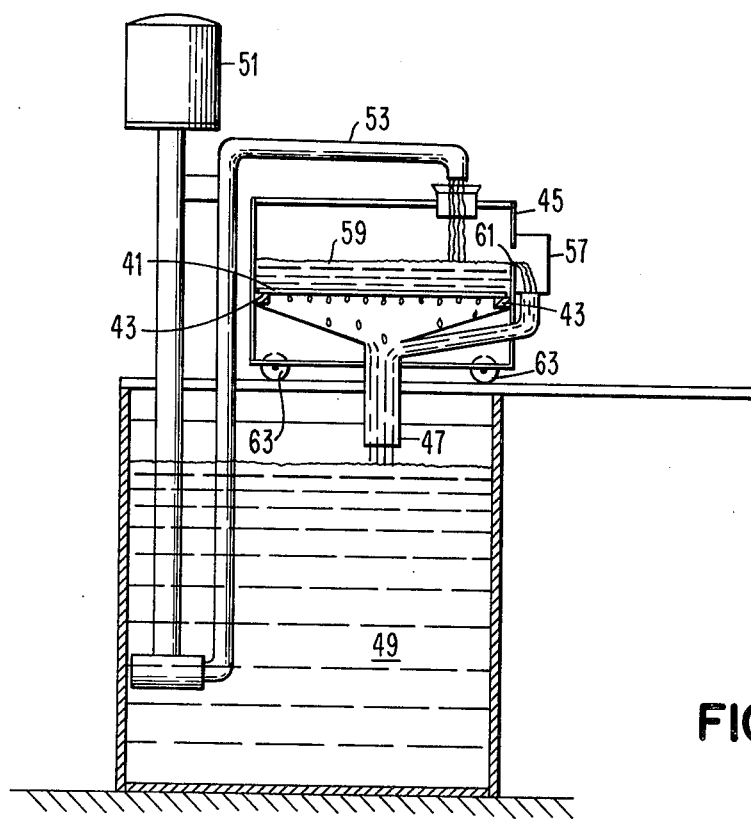
FIG. 3 is a diagramatic representation of apparatus for feeding a unilateral stream of a solution through the through holes of a multilayer printed circuit board according to the present invention.

For the unilateral gravity feeds of the above process, apparatus as illustrated in FIG. 3 can be used. In this apparatus, the board 41 is placed on a support shelf 43 extending around the periphery of the walls so that the board is held substantially flat on the shelf near the wall 45 of a vessel adapted to contain liquids. The underside of the liquid containing vessel below the board is funnel shaped to a trough 47 adapted to return the through drained liquid to a reservoir 49. Liquid is pumped from the reservoir by means of a motor 51 forcing the liquid through a channel 53 and adapted to be poured into the top part of the liquid containing vessel within the walls 45. An overflow trough 57 is connected to one side of the liquid containing vessel so that after the liquid 59 reached a predetermined level, excess liquid drains out through a port 61 into the overflow trough 57 and is returned to the reservoir 49. The liquid containing vessel, with its attendant members including the overflow trough and the return funnel 47, may be mounted on wheels or rollers 63 to facilitate removal of the board and apparatus from the gravity feed tanks.

Using the process and apparatus according to the present invention, it was found possible to prepare clean through holes with etchback of copper innerplanes to the desired depth for through holes having aspect ratios as high as 10:1. For example, for through holes of approximately 15 mils diameter and 150 mils in length, using a gravity feed of chrome/sulfuric acid at a rate of approximately 5cc per minute through each hole, the hole was desirably cleaned and a uniform etchback of approximately 0.3 mils of each innerplane occurs.

Referring again to FIG. 3, it was found that the desired height of the overflow port 61 above the surface of the board 41 is between 7½ and 10 centimeters. This provided sufficient pressure on the surface of the board to provide the desired through flow of between 4 and 6 cubic centimeters per minute of the chrome/sulfuric acid. As a general rule, it was found that using the same return rate, that the overflow port was seldom used for the other gravity feed solutions of the distilled water and the sodium bisulfite solutions, since their viscosities and that of water provided the desired rate of flow through the hole without a buildup of a significant head.

In the preferred embodiment, the chrome/sulfuric acid solution is fed through the board for about 1 minute, although it could go as low as 30 seconds and as high as 5 minutes depending on the amount of etchback desired. Also, while the desired reducing agent is sodium bisulfite in a solution of 21 grams per liter, other suitable reducing agents can be used including ferrous salts and sodium thiosulfate.

A main purpose of the reducing agent is to reduce any $Cr^{+6}$ to $CR^{+3}$ which can be easily removed from waste drain water before it is discharged.

It was found that using this process the etchback of the innerplanes was very uniform, even if initially the innerplanes had much debris such as particle 31 or large, varying smears 29, in FIG. 1 on an innerplane surface. While it is not exactly understood why this occurs, it is believed that the strong solvent not only loosens the fibers, but makes any debris or smear subsequently transparent to the chrome/sulfuric acid solution, thereby allowing the acid to etch the circuit planes back by a uniform amount whether or not they are covered by smear and independent of the amount of smear. It was also found that equivalent results could not be obtained using prior art methods without the unilateral feed, since while the planes in the top and bottom of the hole were properly etched, the planes in the center were not. This is believed to be due to the fact that the etching solution did not uniformly contact the entire surface of the through hole.

It will be readily apparent to those skilled in the art that other modifications and variations can be made to the present invention without departing from the spirit thereof. For example, other solvent solutions could be used to replace the N-methyl-2-pyrrolidone, such as N,N'dimethylformamide and dimethylsulfoxide.

Also, rather than using a gravity feed method to pass the various solutions through the through holes, the solutions can be passed therethrough under pressure; e.g. by using a hydrostatic pressure in a closed environment. As indicated above, other reducing baths could also be used to replace the preferred sodium bisulfite.

It is therefore intended that the invention not be limited to the specifics of the foregoing description of the preferred embodiment, but rather as to embrace the full scope of the following claims.

We claim:

1. A method of cleaning the surfaces of through holes in a multilayered printed circuit board prior to plating therethrough, wherein said printed circuit board consists of a plurality of inner metal circuit planes separated by insulating layers, said cleaning comprising the steps of;

vapor blasting the through holes at approximately right angles to the printed circuit board surface;
placing the board in a solvent to loosen any fibers or smears on the circuit innerplanes of the board, wherein said solvent is a compound selected from the group consisting of N-methyl-2-pyrrolidone, N,N' dimethylformamide, and dimethylsulfoxide;

removing excess solvent from the through holes;

flowing a unilateral stream of a cleaning solution through said through holes, said flow of cleaning solution being sufficient to remove excess fibers and smears in the through holes and produce an etchback of the metal innerplanes of the printed circuit board; and removing any excess cleaning solution from said through holes.

2. The invention according to claim 1 wherein said solvent is N-methyl-2-pyrrolidone and wherein said removing excess solvent from the through holes comprises the steps of:

placing the board in a solution of methyl chloroform; and drying the board.

3. The invention according to claim 1 wherein said cleaning solution is a chrome/sulfuric acid comprising a 40–50% $H_2SO_4$ solution with 50–80 grams per liter of $CrO_3$.

4. The invention according to claim 1 wherein said unilateral stream of a cleaning solution is provided by placing the board in a holder with the board surfaces defining a horizontal plane and the through holes extending therethrough in the vertical and gravity feeding the cleaning solution down through said through holes.

5. The invention according to claim 4 wherein said through holes are approximately 0.015 inches in diameter and said cleaning solution is fed therethrough at a rate of 4–6cc/minute per through holes.

6. The invention according to claim 5 wherein said cleaning solution is fed through said through holes for about one minute.

7. The invention according to claim 1 additionally comprising the steps of reducing any $Cr^{+6}$ to $Cr^{+3}$ by gravity feeding a solution of 21 gram/liter of sodium bisulfite through said through holes.

8. The invention according to claim 1 additionally comprising the steps of:

having a running rinse of said board with deionized water;

having a stagnant rinse of said board in deionized water;

blow drying said board; and a second vapor blasting of said through holes at approximately right angles to the printed circuit board surface.

* * * * *